(12) United States Patent
Ahn

(10) Patent No.: US 11,984,426 B2
(45) Date of Patent: May 14, 2024

(54) SEMICONDUCTOR PACKAGE

(71) Applicant: SAMSUNG ELECTRONICS CO., LTD., Suwon-si (KR)

(72) Inventor: Seokgeun Ahn, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/890,835

(22) Filed: Aug. 18, 2022

(65) Prior Publication Data

US 2022/0392870 A1    Dec. 8, 2022

Related U.S. Application Data

(63) Continuation of application No. 16/844,642, filed on Apr. 9, 2020, now Pat. No. 11,424,218.

(30) Foreign Application Priority Data

Aug. 28, 2019   (KR) .................. 10-2019-0106026

(51) Int. Cl.
*H01L 23/48*      (2006.01)
*H01L 23/13*      (2006.01)
(Continued)

(52) U.S. Cl.
CPC .......... *H01L 25/0652* (2013.01); *H01L 23/13* (2013.01); *H01L 25/18* (2013.01);
(Continued)

(58) Field of Classification Search
CPC . H01L 25/0657; H01L 25/0652; H01L 25/18; H01L 23/13
See application file for complete search history.

(56) References Cited

U.S. PATENT DOCUMENTS 6,879,423 B2   4/2005   Kim et al.
7,884,460 B2   2/2011   Mm et al.
(Continued)

FOREIGN PATENT DOCUMENTS

KR   10-2013-0051708 A   5/2013
KR   10-2018-0060890 A   6/2018

OTHER PUBLICATIONS

Communication issued Jan. 17, 2024 by the Korean Intellectual Property Office in Korean Patent Application No. 10-2019-0106026.

*Primary Examiner* — Hoa B Trinh
(74) *Attorney, Agent, or Firm* — Sughrue Mion, PLLC

(57) ABSTRACT

A semiconductor package is provided. The semiconductor package includes: a package substrate having a first surface, a second surface that is provided opposite the first surface and has a concave portion, and a through-hole having a side surface that is oblique with respect to the first surface, and a first diameter of a first opening of the through-hole defined through the first surface being less than a second diameter of a second opening of the through-hole defined through a bottom surface of the concave portion; a plurality of first semiconductor chips provided on the first surface; a second semiconductor chip provided on the bottom surface; and a molding portion provided in the through-hole, and covering the plurality of first semiconductor chips and the second semiconductor chip.

10 Claims, 12 Drawing Sheets

(51) Int. Cl.
*H01L 25/065* (2023.01)
*H01L 25/18* (2023.01)

(52) U.S. Cl.
CPC ........ *H01L 2225/0651* (2013.01); *H01L 2225/06517* (2013.01); *H01L 2225/06558* (2013.01); *H01L 2225/06562* (2013.01); *H01L 2225/06586* (2013.01)

(56) References Cited

U.S. PATENT DOCUMENTS

| | | |
|---|---|---|
| 8,338,941 B2 | 12/2012 | Lee et al. |
| 9,437,586 B2 | 9/2016 | Hong |
| 9,735,136 B2 | 8/2017 | Silvestri et al. |
| 9,847,319 B2 | 12/2017 | Song et al. |
| 2007/0241441 A1 | 10/2007 | Choi et al. |
| 2013/0119553 A1 | 5/2013 | Jeong et al. |
| 2017/0025385 A1* | 1/2017 | Song ................. H01L 25/18 |
| 2018/0173932 A1 | 6/2018 | Huang et al. |
| 2018/0190776 A1 | 7/2018 | Gogineni et al. |
| 2020/0168550 A1* | 5/2020 | Ryu .................. H01L 24/19 |

* cited by examiner

A

SEMICONDUCTOR PACKAGE

CROSS-REFERENCE TO RELATED APPLICATION(S)

This is a Continuation application of U.S. application Ser. No. 16/844,642, filed Apr. 9, 2020, which claims priority from Korean Patent Application No. 10-2019-0106026, filed on Aug. 28, 2019 in the Korean Intellectual Property Office, the disclosures of which are incorporated herein by reference in their entireties.

BACKGROUND

1. Field

Devices and methods consistent with example embodiments relate to a semiconductor package.

2. Related Art

With the ongoing development of the electronic industry, there is a growing demand for increasingly high-performance, high-speed and compact electronic components. In response, technologies have emerged in which semiconductor chips are stacked and mounted on a single semiconductor substrate. However, such technologies may result in a thicker semiconductor package with inferior bonding stability.

SUMMARY

Example embodiments provide a semiconductor package capable of reducing an overall package thickness, and molding semiconductor chips mounted on both sides of a package substrate using a single process.

According to an aspect of an example embodiment, a semiconductor package includes a package substrate having a first surface, a second surface that is opposite the first surface and has a concave portion, and a through-hole having a side surface that is oblique with respect to the first surface, and a first diameter of a first opening of the through-hole defined through the first surface being less than a second diameter of a second opening of the through-hole defined through a bottom surface of the concave portion; a plurality of first semiconductor chips provided on the first surface; a second semiconductor chip provided on the bottom surface; and a molding portion provided in the through-hole, and covering the plurality of first semiconductor chips and the second semiconductor chip. Each of the plurality of first semiconductor chips includes a memory chip, and the second semiconductor chip includes an application processor.

According to an aspect of an example embodiment, a semiconductor package includes a package substrate having a first surface, a second surface that is opposite the first surface and has a concave portion, and a through-hole having a side surface that is oblique with respect to the first surface, a first diameter of a first opening of the through-hole defined through the first surface being less than a second diameter of a second opening of the through-hole defined through a bottom surface of the concave portion, and the bottom surface of the concave portion defining a trench that extends from the through-hole to a side surface of the concave portion; a plurality of first semiconductor chips provided on the first surface; a second semiconductor chip provided on the bottom surface; and a molding portion provided in the through-hole and the trench, and covering the plurality of first semiconductor chips and the second semiconductor chip.

According to an aspect of an example embodiment, a semiconductor package includes a package substrate having a first surface having a first region and a second region, a second surface that is opposite the first surface and has a concave portion, and a through-hole having a side surface that is oblique with respect to the first surface, a first diameter of a first opening of the through-hole defined through the first surface being less than a second diameter of a second opening of the through-hole defined through a bottom surface of the concave portion, and the through-hole being provided in the second region; a plurality of first semiconductor chips provided on the first region; a second semiconductor chip provided on the bottom surface and overlapping the through-hole; and a molding portion provided in the through-hole, and covering the plurality of first semiconductor chips and the second semiconductor chip. Each of the plurality of first semiconductor chips includes a memory chip, and the second semiconductor chip includes an application processor.

BRIEF DESCRIPTION OF DRAWINGS

The above and other aspects, features and advantages will be more clearly understood from the following detailed description of example embodiments, taken in conjunction with the accompanying drawings, in which.

DETAILED DESCRIPTION

Hereinafter, example embodiments will be described in detail with reference to the attached drawings.

Figure 1:
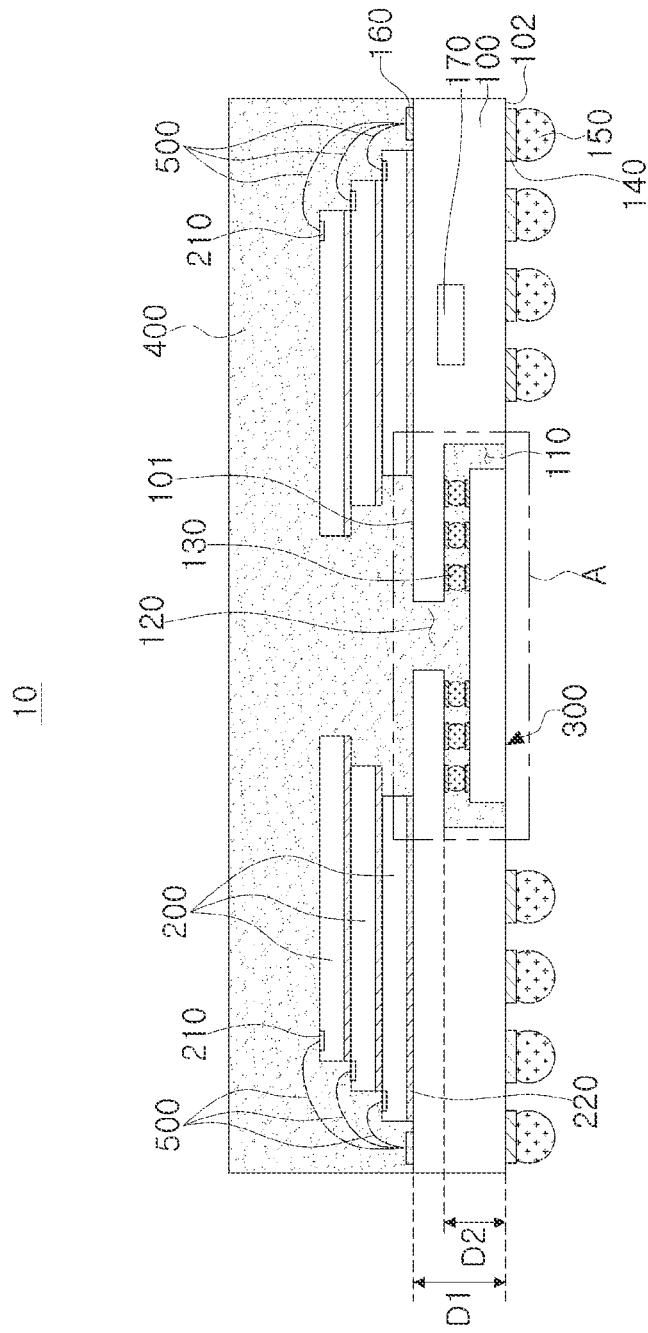
FIG. 1 is a side cross-sectional view of a semiconductor package according to an example embodiment.
Figure 2:
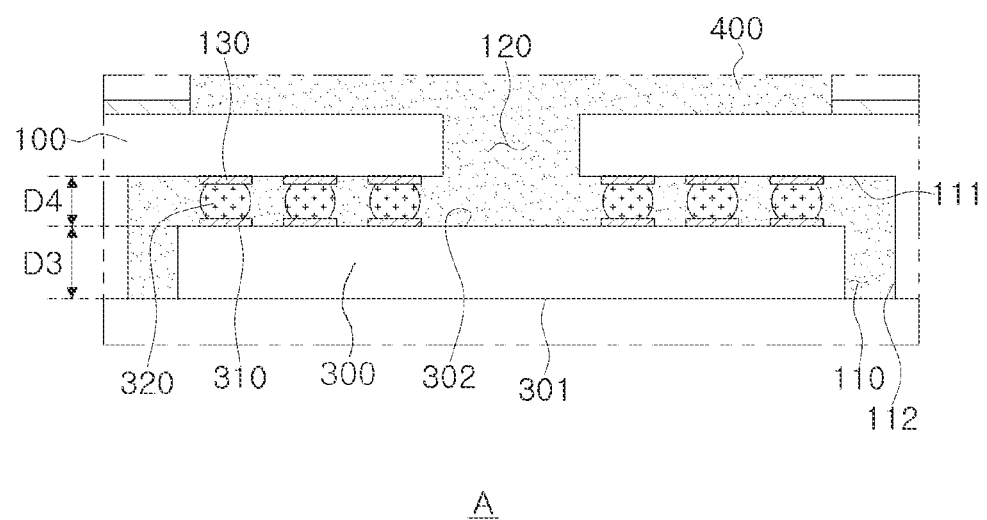
FIG. 2 is an enlarged view of a portion A of FIG. 1 according to an example embodiment.
Figure 3:
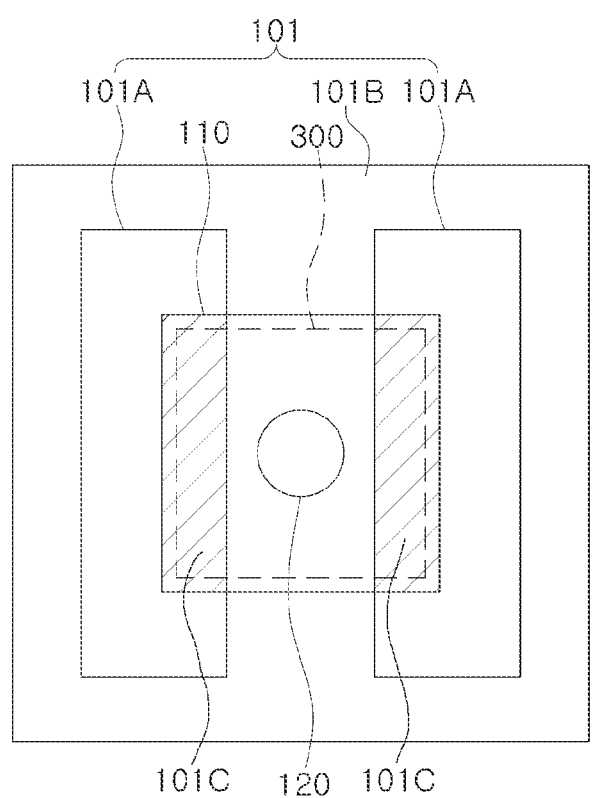
FIG. 3 is a layout view of the semiconductor package of the top of the semiconductor package of FIG. 1 according to an example embodiment.
Figure 4:
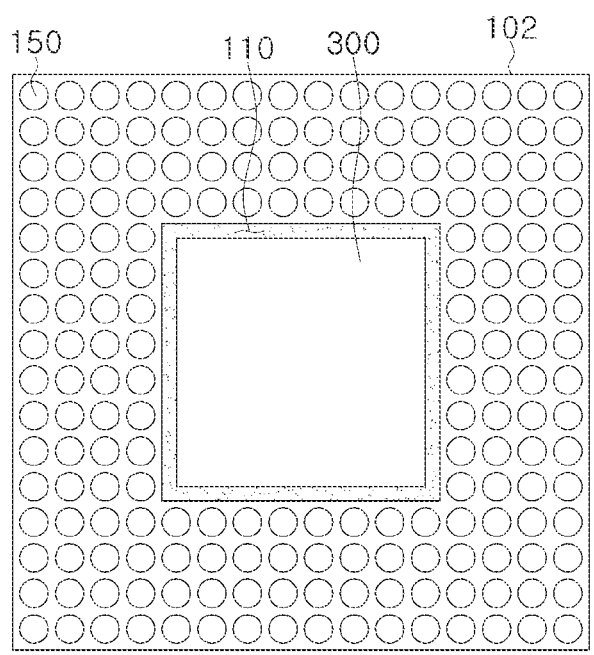
FIG. 4 is a layout view of the bottom of the semiconductor package of FIG. 1 according to an example embodiment.
Figure 5:
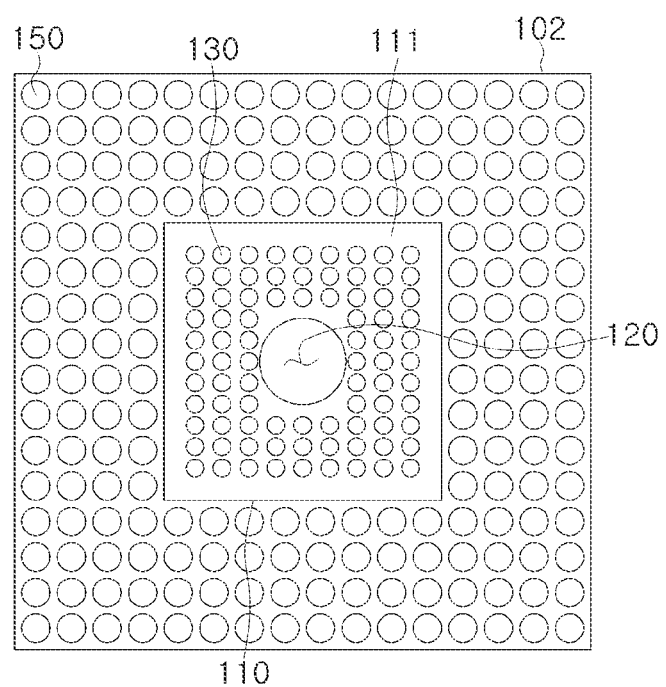
FIG. 5 is a view illustrating the package substrate of FIG. 4 from which a second semiconductor chip is removed according to an example embodiment.

Referring to FIGS. 1 to 5, a semiconductor package according to an example embodiment will be described. FIG. 1 is a side cross-sectional view of a semiconductor package according to an example embodiment, and FIG. 2 is an enlarged view of a portion A of FIG. 1. FIG. 3 is a layout view of the top of the semiconductor package of FIG. 1, and FIG. 4 is a layout view of the bottom of the semiconductor package of FIG. 1. FIG. 5 is a view illustrating the package substrate of FIG. 4 from which a second semiconductor chip is removed.

Referring to FIGS. 1 and 2, a semiconductor package 10 according to an example embodiment includes a package substrate 100, first semiconductor chips 200, a second semiconductor chip 300, and a molding portion 400.

The package substrate 100 includes a first surface 101 and a second surface 102, the second surface 102 being opposite the first surface 101 and provided with a concave portion 110. The package substrate 100 may be a single layer printed circuit board. The package substrate 100 may be a multilayer printed circuit board and may include, for example, a passive element 170 such as a capacitor. The second surface 102 may be provided with ball lands 140, and a bump 150 may be attached to each of the ball lands 140. In an example embodiment, a thickness D1 of the package substrate 100 may be at least 460 μm.

Referring to FIGS. 1 and 3, the first surface 101 of the package substrate 100 may include a first region 101A and a second region 101B. The first semiconductor chips 200 may be disposed in the first region 101A. The first semiconductor chips 200 may be attached to the package substrate 100 in the first region 101A. For example, a lowermost portion of the first semiconductor chips 200 may be in contact with the package substrate 100. Through-hole 120 may pass through the first surface 101 and the second surface 102 of the second region 101B of the package substrate 100. First connection pads 160 electrically connected to the first semiconductor chips 200 in a wire bonding method may be provided in the second region 101B. The first region 101A may overlap the concave portion 110 in a region 101C.

The first semiconductor chips 200 may be the same type of memory chips, for example, memory chips having the same capacity. The memory chip may be a Phase change Random Access Memory (PRAM), a Resistive Random Access Memory (RRAM), a Magnetic Random Access Memory (MRAM), a Dynamic Random Access Memory (DRAM), a Flash Memory, or the like. The first semiconductor chips 200 may be provided as a plurality of layers stacked on the first surface 101 of the package substrate 100, and may be bonded and fixed to each other by an adhesive layer 220. In an example embodiment, the first semiconductor chips 200 may be electrically connected to the first connection pads 160, respectively, in a wire bonding method. That is, chip pads 210 of the first semiconductor chips 200 may be connected to the first connection pads 160, respectively, by a wire 500.

Referring to FIGS. 1 and 4, a concave portion 110 may be formed in a central region of the second surface 102. However, example embodiments are not limited thereto and the concave portion 110 may be disposed in other positions not in contact with a side surface of the package substrate 100. Referring to FIG. 5, in which the second semiconductor chip 300 is removed from FIG. 4, second connection pads 130 on which the second semiconductor chip 300 is mounted may be disposed on a bottom surface 111 of the concave portion 110. The second connection pads 130 may be electrically connected to the first connection pads 160 through an internal wiring inside the package substrate 100. The ball lands 140 to which the bump 150 is attached may be disposed in the periphery of the concave portion 110. Moreover, the through-hole 120 is formed through the bottom surface 111 of the concave portion 110.

The concave portion 110 may be large enough to accommodate the second semiconductor chip 300 therein. That is, the concave portion may have a size that is larger than the semiconductor chip 300 so that a side wall 112 of the concave portion 110 is not in contact with the second semiconductor chip 300 when the semiconductor chip 300 is provided in the concave portion 110 (see FIG. 2). In some example embodiments, the concave portion 110 may be formed to have a depth D2 allowing an upper surface 301 of the second semiconductor chip 300 mounted thereon to be exposed. However, example embodiments are not limited thereto and the depth D2 of the concave portion 110 may be varied as a depth allowing the upper surface 301 of the second semiconductor chip 300 to be protruding or recessed.

FIG. 4 illustrates that the concave portion 110 is quadrangular, but example embodiments are not limited thereto. According to other example embodiments, the concave portion may have various polygonal shapes such as a triangle and a pentagon.

The package substrate 100 may include a plurality of concave portions 110, and a plurality of second semiconductor chips may be provided in the plurality of concave portions 110. For example, the number of concave portions 110 may be the same as the number of second semiconductor chips 300. In this case, each concave portion 110 may be large enough to allow a single second semiconductor chip 300 to be mounted thereon.

Figure 6:
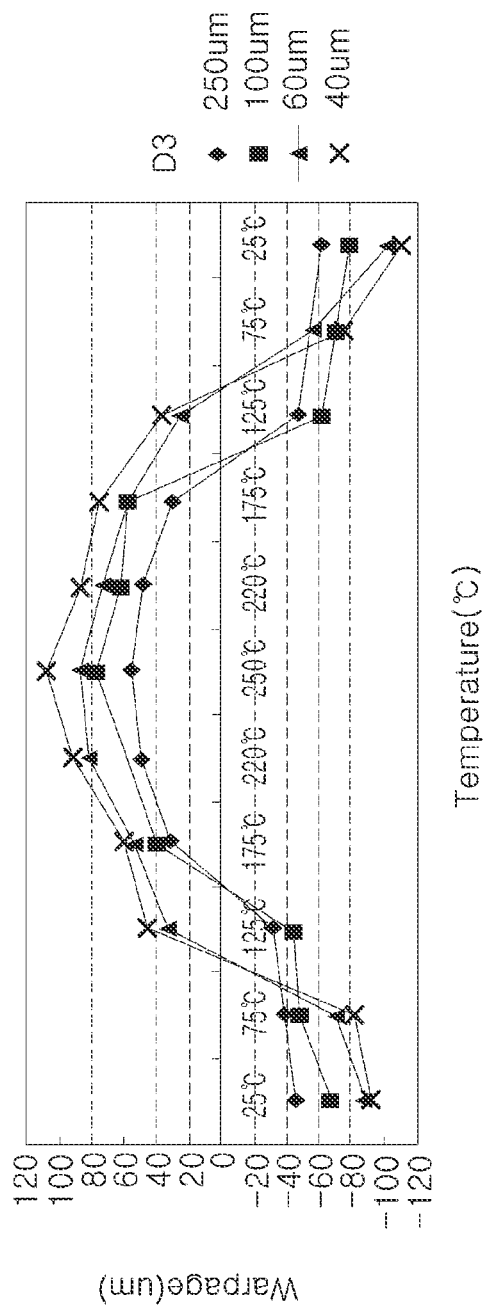
FIG. 6 is a graph illustrating warpage of a semiconductor package.

FIG. 6 is a graph illustrating warpage in second semiconductor chips 300 having various thicknesses D3 are mounted on a concave portion 110 of a package substrate 100 having a thickness D1 of 460 μm (see FIGS. 1 and 2). Warpage occurring in each semiconductor package 10 is measured according to a temperature change and thickness D3. The change in temperature during a process of manufacturing a semiconductor package is shown along the x-axis. As the temperature changes, warpage remains within +120 μm to −120 μm occurs in each semiconductor package 10.

Figure 7:
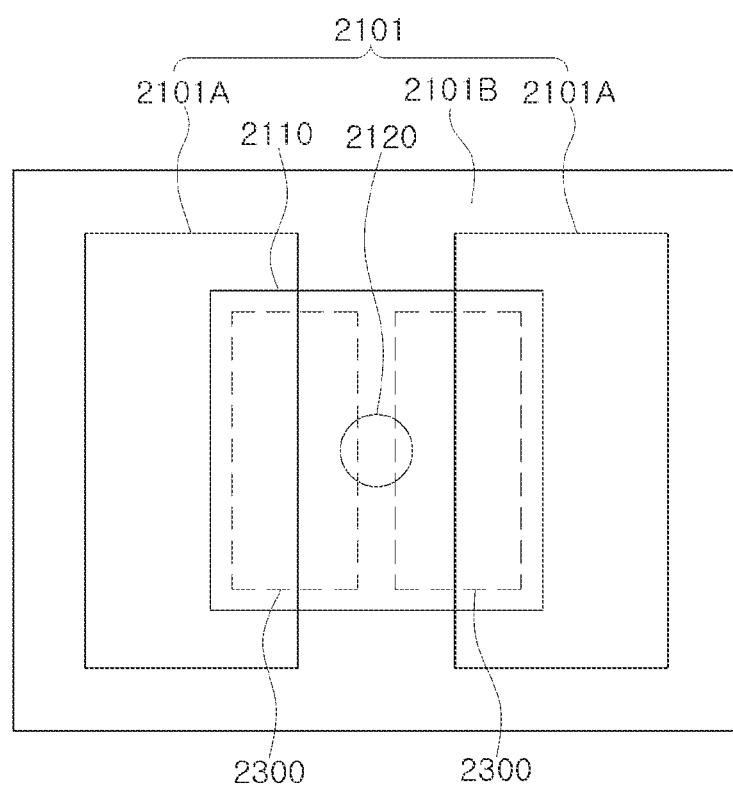
FIGS. 7 to 9 illustrate semiconductor packages according to example embodiments.
Figure 8:
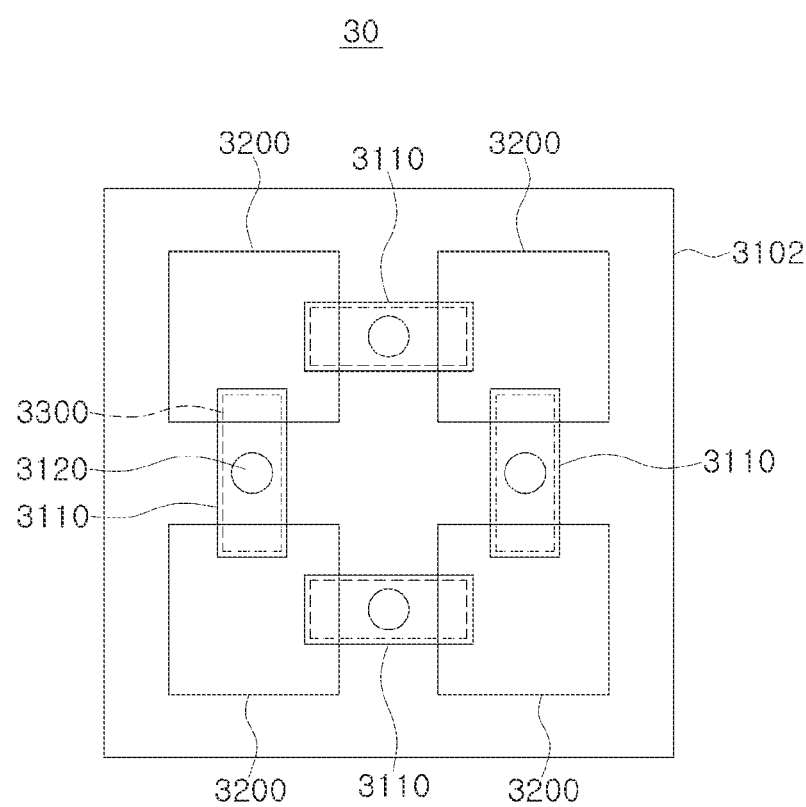
Figure 9:
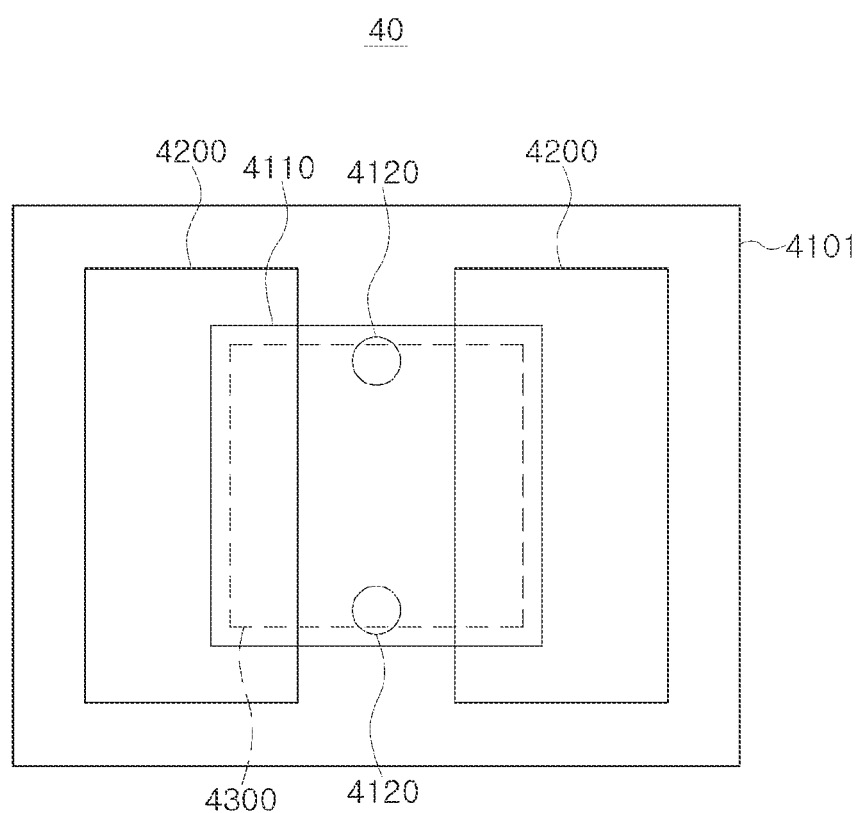

As discussed above with reference to FIGS. 1 to 5, a single second semiconductor chip 300 may be provided in a single concave portion 110. However, example embodiments are not limited thereto. FIGS. 7 to 9 semiconductor packages according to additional example embodiments. FIG. 7 illustrates a semiconductor package 20 according to an example embodiment. Referring to FIG. 7, in some example embodiments, a plurality of second semiconductor chips 2300 may be mounted on a single concave portion 2110. A first region 2101A and a second region 2101B are provided in a first surface 2101 of a semiconductor package 20, and a through-hole 2120 is formed in the second region 2101B. This is substantially similar to the example embodiment described previously, and thus, a detailed description thereof will be omitted.

FIG. 8 illustrates a semiconductor package 30 according to an example embodiment. Referring to FIG. 8, in some example embodiments, a plurality of concave portions 3110 may be provided on a second surface 3102 of the semiconductor package 30, and a second semiconductor chip 3300 may be disposed in each concave portion 3110. In this case, the concave portion 3110 may be disposed to connect first semiconductor chips 3200. That is, a single concave portion 3110 may be disposed to have a region overlapping two first semiconductor chips 3200. Moreover, a through-hole 3120 may disposed in each of the plurality of concave portions 3110. This is substantially similar to the example embodiment described previously, and thus, a detailed description thereof will be omitted.

Referring to FIGS. 1 and 2, the second semiconductor chip 300 may be mounted on a bottom surface of the concave portion 110. One surface of the second semiconductor chip 300 may be provided with chip pads 310. The chip pads 310 of the second semiconductor chip 300 may be mounted on the second connection pads 130 disposed on the bottom surface 111 of the concave portion 110. For example, the chip pads 310 and second connection pads 130 may be connected by a solder 320 in a flip chip bonding method. Thus, the second semiconductor chip 300 may be mounted on the bottom surface 111 of the concave portion 110 such that a surface of the first semiconductor chip 200 with chip pads 310 disposed thereon is disposed opposite an upper surface of the semiconductor package 10. When the second semiconductor chip is mounted in a flip chip bonding method, a distance D4 of about 45 μm may be provided between the second semiconductor chip 300 and a bottom surface 111 of the concave portion 110.

In an example embodiment, the second semiconductor chip 300 may be an application processor. Thus, in an example embodiment, memory chips are disposed on the first surface 101 of the package substrate 100, and a System In Package (SIP) structure may be provided, in which an application processor is disposed in the concave portion 110 of the second surface 102. Thus, as compared with a Package-On-Package (POP) structure, in which each of a memory chip and an application processor is mounted on a separate package substrate, and is then stacked, an overall thickness of the semiconductor package 10 may be reduced, and the number of electrical paths between a memory chip and an application processor may be reduced. In an example embodiment, a thickness D3 of the second semiconductor chip 300 may be 100 μm to 200 μm.

As discussed above, a through-hole 120 passing through the first surface 101 and the second surface 102 may be disposed in the bottom surface 111 of the concave portion 110. The through-hole 120 may be large enough to allow a resin solution for formation of a molding portion 400 to pass therethrough. Thus, in a process of molding the first semiconductor chips 200 mounted on the first surface 101, a resin solution may be injected through the through-hole 120, so the second semiconductor chip 300 disposed in the concave portion 110 may be molded simultaneously with the first semiconductor chips 200. In an example embodiment, the through-hole 120 is disposed in a central region of the concave portion 110, but example embodiments are not limited thereto. Alternatively, the through-hole may be disposed in a peripheral region of the concave portion 110.

FIG. 9 illustrates a semiconductor package 40 according to an example embodiment. In some example embodiments, as illustrated in FIG. 9, a plurality of through-holes 4120 may be provided, and the plurality of through-holes may be disposed along a peripheral region of a concave portion 4110. In this case, in a process of manufacturing a semiconductor package 40 by molding the first semiconductor chips 4200 mounted on the first surface 4101, a resin solution may be injected through a peripheral region of the second semiconductor chip 4300. Thus, as compared with the case in which a through-hole is formed at a central region of the concave portion, pressure applied to a second semiconductor chip 4300 mounted may be reduced in a process of injecting a resin solution. Moreover, the through-hole 4120 may be disposed to not overlap the first semiconductor chips 4200, thereby reducing application of pressure to the first semiconductor chip 4200 in the process of injecting a resin solution.

Figure 10:
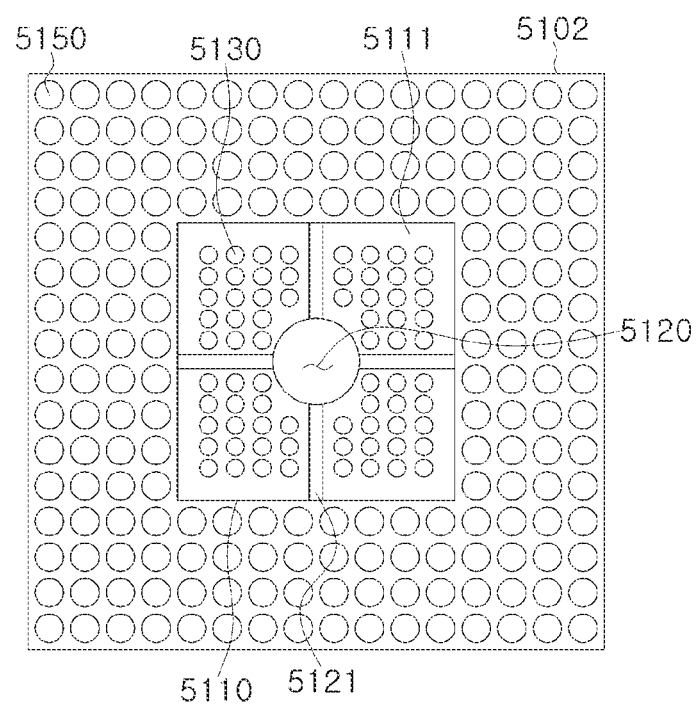
FIG. 10 is a view illustrating a package substrate from which a second semiconductor chip is removed according to an example embodiment.

FIG. 10 is a view illustrating a package substrate from which a second semiconductor chip is removed according to an example embodiment. Referring to FIG. 10, in some example embodiments, a trench 5121 connected to a through-hole 5120 may be disposed on a bottom surface 5111 of a concave portion 5110. In this case, in a process of forming a molding portion of the semiconductor package 50, a resin solution, injected through the through-hole 5120, may be dispersed more quickly into the concave portion 5210 through the trench 5121. The trench 5121 may be formed to extend from the through-hole 5120 to a side wall of the concave portion 5110. The trench 5121 may be provided between second connection pads 5130 disposed on the bottom surface 5111. As illustrated, four trenches 5121 having a linear form are disposed in the periphery of the through-hole 5120, however example embodiments are not limited thereto. Alternatively, the number and arrangement of trenches 5121 may vary. A concave portion 5110 is formed in the second surface 5102, and a bump 5150 is disposed in the periphery of the concave portion 5110. This is substantially similar to example embodiments described previously, and thus a detailed description thereof will be omitted.

As illustrated in FIG. 1, the molding portion 400 may cover the first semiconductor chips 200 and the second semiconductor chip 300, and may fill the through-hole 120. The molding portion 400 may be formed by molding an epoxy-based resin solution. The package substrate 100, on which the first semiconductor chips 200 and the second semiconductor chip 300 are mounted, may be disposed in a mold, and a transfer molding process of pressing a resin solution into the mold may be performed to form a molding portion 400. The resin solution may be injected towards the first surface 101 of the package substrate 100, and the concave portion 110 formed in the second surface 102 of the package substrate 100 may be filled through the through-hole 120. Thus, the first surface 101 and the second surface 102, of the package substrate 100, may be molded simultaneously through a single molding process.

Figure 11:
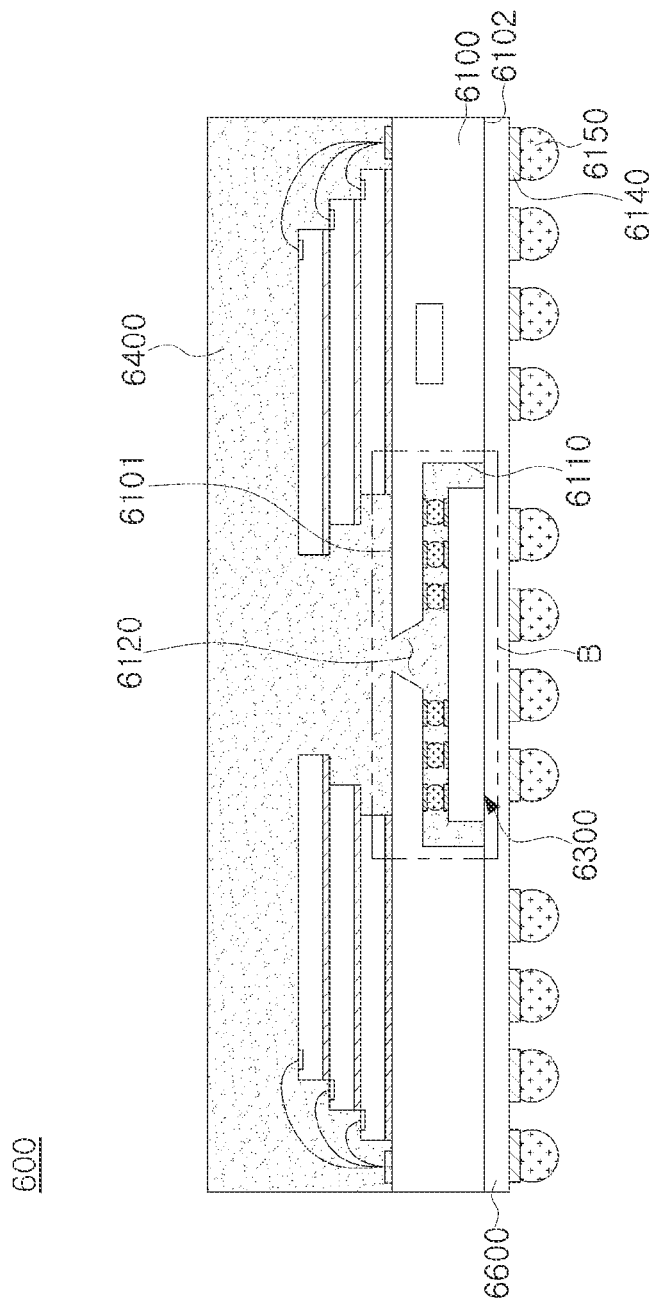
FIG. 11 is a side cross-sectional view of a semiconductor package according to an example embodiment.
Figure 12:
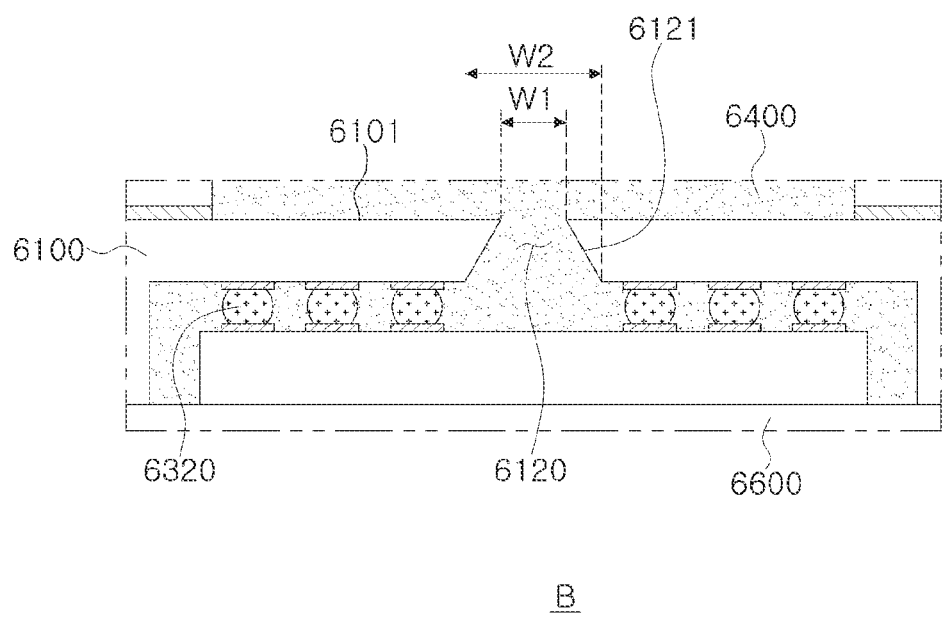
FIG. 12 is an enlarged view of a portion B of FIG. 11 according to an example embodiment.

Referring to FIGS. 11 and 12, a semiconductor package according to an example embodiment will be described. FIG. 11 is a side cross-sectional view of a semiconductor package 600 according to an example embodiment, and FIG. 12 is an enlarged view of a portion B of the semiconductor package 600 FIG. 11. Compared with the semiconductor package 10 described previously, there the through-hole 6120 has a different shape, and a redistribution layer 6600 is provided on a second surface 6102 of a package substrate 6100. In order to prevent the description from being duplicated, differences will be mainly described.

In an example embodiment, a through-hole 6120 may be narrower along the first surface 6101 than along the second surface 6102 of the package substrate 6100. For example, the through-hole 6120 may have inclined side surfaces. That is, the side surface 6121 of the through-hole 6120 may be oblique with respect to the first surface 6101 and the second surface 6102. Thus, a size W2 of the through-hole 6120 exposed to a bottom surface of the concave portion 6110 may be greater than a size W1 of the through-hole 6120 exposed to the first surface 6101. Because the size W1 of the through-hole 6120 exposed to the first surface 6101 into which a resin solution is injected is less than the size W2 of the through-hole 6120 exposed to a bottom surface of the concave portion 6110, pressure per unit area, applied during a process of injecting a resin solution from the first surface 6101 to the second surface 6102 through the through-hole 6120, may be reduced. When the molding portion 6400 is formed through transfer molding, the package substrate 6100 is disposed in a mold, and a resin solution is injected into the mold at high pressure. If excessive high pressure is applied to the second semiconductor chip 6300 in this process, cracking may occur in a solder 6320, and a loose connection of the second semiconductor chip 6300 may occur. As a shape of the through-hole 6120 is inclined, excessive pressure applied to the second semiconductor chip 6300 mounted in a process of injecting a resin solution may be relieved, and adhesion of the second semiconductor chip 6300 mounted on the second surface 6102 being weakened may be prevented.

The redistribution layer 6600 is attached to the second surface 6102 of the package substrate 6100, and may cover the second semiconductor chip 6300. The redistribution layer 6600 is disposed in a lower portion of the second semiconductor chip 6300, so a bump 6150 and ball lands 6140 may also be disposed in the lower portion of the second semiconductor chip 6300.

As set forth above, according to example embodiments, an overall thickness of a semiconductor package may be reduced, and semiconductor chips mounted on both sides of the package substrate may be molded using a single process.

While example embodiments have been shown and described above, it will be apparent to those skilled in the art that modifications and variations may be made without departing from the scope of the present disclosure, as defined by the appended claims.

What is claimed is:

1. A semiconductor package comprising:
a package substrate having a first surface having a plurality of first connection pads, a second surface that is opposite the first surface and having a concave portion and ball lands disposed in a peripheral region of the concave portion, a through-hole passing through the first surface and the second surface on a bottom surface of the concave portion, and a plurality of second connection pads disposed in a peripheral region of the through-hole on the bottom surface;
at least one first semiconductor chip mounted on the first surface and electrically connected to the plurality of first connection pads;
at least one second semiconductor chip mounted on the bottom surface of the concave portion and electrically connected to the plurality of second connection pads; and
external terminals respectively attached to the ball lands.

2. The semiconductor package of claim 1, further comprising a molding portion covering the at least one first semiconductor chip and the at least one second semiconductor chip and filling the through-hole and the concave portion.

3. The semiconductor package of claim 2, wherein the molding portion covers an upper surface of the at least one second semiconductor chip.

4. The semiconductor package of claim 1, wherein the at least one first semiconductor chip and the at least one second semiconductor chip are different type of semiconductor chips.

5. The semiconductor package of claim 1, wherein the at least one second semiconductor chip comprises a plurality of chip pads electrically connected to the plurality of second connection pads, and
wherein the plurality of chip pads does not overlap the through-hole.

6. The semiconductor package of claim 1, wherein the plurality of chip pads is disposed toward the bottom surface of the concave portion of the at least one second semiconductor chip.

7. A semiconductor package comprising:
a package substrate having a first surface, a second surface that is opposite the first surface and has a concave portion, and a through-hole having a side surface that is oblique with respect to the first surface, a first diameter of a first opening of the through-hole defined through the first surface being less than a second diameter of a second opening of the through-hole defined through a bottom surface of the concave portion;
a plurality of first semiconductor chips provided on the first surface;
a second semiconductor chip provided on the bottom surface; and
a molding portion provided in the through-hole, and covering the plurality of first semiconductor chips and the second semiconductor chip,
wherein the package substrate comprises a passive element.

8. The semiconductor package of claim 7, wherein each of the plurality of first semiconductor chips comprises a memory chip, and the second semiconductor chip comprises an application processor.

9. The semiconductor package of claim 7, wherein the concave portion overlaps the plurality of first semiconductor chips.

10. The semiconductor package of claim 7, wherein the concave portion is one from among a plurality of concave portions of the second surface,
wherein the second semiconductor chip is one from among a plurality of second semiconductor chips, and
wherein the plurality of second semiconductor chips is provided on the plurality of concave portions, respectively.

* * * * *